(12) United States Patent
Lorusso et al.

(10) Patent No.: US 12,278,086 B2
(45) Date of Patent: Apr. 15, 2025

(54) PATTERN HEIGHT METROLOGY USING AN E-BEAM SYSTEM

(71) Applicants: IMEC VZW, Leuven (BE); Katholieke Universiteit Leuven, KU LEUVEN R&D, Leuven (BE)

(72) Inventors: Gian Francesco Lorusso, Overijse (BE); Mohamed Saib, Evere (BE); Alain Moussa, Genval (BE); Anne-Laure Charley, Hamme-Mille (BE); Danilo De Simone, Leuven (BE); Joren Severi, Leuven (BE)

(73) Assignees: IMEC VZW, Leuven (BE); Katholieke Universiteit Leuven, Leuven (BE)

( * ) Notice: Subject to any disclaimer, the term of this patent is extended or adjusted under 35 U.S.C. 154(b) by 502 days.

(21) Appl. No.: 17/830,606

(22) Filed: Jun. 2, 2022

(65) Prior Publication Data

US 2022/0392742 A1 Dec. 8, 2022

(30) Foreign Application Priority Data

Jun. 2, 2021 (EP) .................................... 21177290

(51) Int. Cl.
*H01J 37/28* (2006.01)
*G03F 7/00* (2006.01)
(Continued)

(52) U.S. Cl.
CPC .......... *H01J 37/28* (2013.01); *G03F 7/70625* (2013.01); *H01J 37/222* (2013.01);
(Continued)

(58) Field of Classification Search
CPC ........ H01J 37/28; H01J 37/222; H01J 37/263; H01J 2237/2815; H01J 2237/2817;
(Continued)

(56) References Cited

U.S. PATENT DOCUMENTS 6,670,612 B1 12/2003 Lorusso et al.
6,683,308 B2 1/2004 Itagaki et al.
(Continued)

FOREIGN PATENT DOCUMENTS

EP 0712047 A2 5/1996
EP 0712047 A3 5/1997

OTHER PUBLICATIONS

Extended European Search Report and Written Opinion, Application No. EP21177290.0, mailed Dec. 2, 2021, 5 pages.
(Continued)

*Primary Examiner* — David E Smith
*Assistant Examiner* — Hsien C Tsai
(74) *Attorney, Agent, or Firm* — McDonnell Boehnen Hulbert & Berghoff LLP

(57) ABSTRACT

The present disclosure relates to the determination of a pattern height of a pattern, which has been produced with extreme ultraviolet (EUV) lithography in a resist film. The determination is performed by using an electron beam (e-beam) system, in particular, by using a scanning electron microscope (SEM). In this respect, the disclosure provides a device for determining the pattern height, wherein the device comprising a processor. The processor is configured to obtain a SEM image of the pattern from an SEM. Further, the processor is configured to determine a contrast value related to the pattern based on the obtained SEM image. Subsequently, the processor is configured to determine the pattern height based on calibration data and the determined contrast value.

20 Claims, 6 Drawing Sheets

(51) Int. Cl.
*H01J 37/22* (2006.01)
*H01J 37/26* (2006.01)

(52) U.S. Cl.
CPC ... *H01J 37/263* (2013.01); *H01J 2237/24578* (2013.01); *H01J 2237/2817* (2013.01); *H01J 2237/2826* (2013.01)

(58) Field of Classification Search
CPC .... H01J 2237/2826; H01J 2237/24578; G03F 7/70608; G03F 7/70625; G03F 7/70655
See application file for complete search history.

(56) References Cited

U.S. PATENT DOCUMENTS

| | | | |
|---|---|---|---|
| 6,930,308 | B1 | 8/2005 | Lorusso et al. |
| 7,361,941 | B1 | 4/2008 | Lorusso et al. |
| 7,423,269 | B1 | 9/2008 | Azordegan et al. |
| 8,300,919 | B2 | 10/2012 | Yamaguchi et al. |
| 9,236,218 | B2 * | 1/2016 | Murakawa ............ H01J 37/256 |
| 9,646,804 | B2 * | 5/2017 | Foucher .................. H01J 37/28 |
| 2009/0212211 | A1 | 8/2009 | Iwasaki et al. |
| 2009/0214103 | A1 | 8/2009 | Tanaka et al. |
| 2012/0076991 | A1 | 3/2012 | Hoshino et al. |
| 2020/0380668 | A1 | 12/2020 | Schwarzband et al. |

OTHER PUBLICATIONS

Jau, Jack, Wei Fang, and Hong Xiao. "A Novel Method for In-line Process Monitoring by Measuring the Gray Level Values of SEM Images." In ISSM 2005, IEEE International Symposium on Semiconductor Manufacturing, 2005., pp. 143-146. IEEE, 2005.

Lei, Ming-Ta, Kok-Hiang Tang, Yung-Chih Wang, Chia-Hsing Huang, Chih-Cherng Jeng, Lu-Kai Wang, Wei Fang et al. "In-line semi-electrical process diagnosis methodology for integrated process window optimization of 65nm and below technology nodes." In Metrology, Inspection, and Process Control for Microlithography XX, vol. 6152, pp. 642-649. SPIE, 2006.

Vaid, Alok, Bin Bin Yan, Yun Tao Jiang, Mark Kelling, Carsten Hartig, John Allgair, Peter Ebersbach et al. "A holistic metrology approach: hybrid metrology utilizing scatterometry, CD-AFM, and CD-SEM." In Metrology, Inspection, and Process Control for Microlithography XXV, vol. 7971, pp. 21-40. SPIE, 2011.

Ohashi, Takeyoshi, Atsuko Yamaguchi, Kazuhisa Hasumi, Masami Ikota, Gian Lorusso, Chi Lim Tan, and Arnaud Furnémont. "Precise measurement of thin-film thickness in 3D-NAND device with CD-SEM." Journal of Micro/Nanolithography, MEMS, and MOEMS 17, No. 2 (2018): 024002.

Ueda, K., S. Koshihara, and T. Mizuno. "The study of high-sensitive and accurate metrology method by using CD-SEM." In Metrology, Inspection, and Process Control for Microlithography XXVI, vol. 8324, pp. 774-786. SPIE, 2012.

* cited by examiner

PATTERN HEIGHT METROLOGY USING AN E-BEAM SYSTEM

CROSS-REFERENCE TO RELATED APPLICATIONS

The present application is a non-provisional patent application claiming priority to European Patent Application No. 21177290.0, filed Jun. 2, 2021, the contents of which are hereby incorporated by reference.

FIELD OF THE DISCLOSURE

The present disclosure relates to the determination of a pattern height of a pattern, which has been produced with extreme ultraviolet (EUV) lithography in a resist film. The determination of the pattern height—also referred to as pattern height metrology in this disclosure—is performed by using an electron beam (e-beam) system, in particular, by using a scanning electron microscope (SEM). In this respect, the disclosure provides a device and a method for determining the pattern height, and a computer program for executing the method.

BACKGROUND

E-beam systems, like SEMs, may be used to measure top-down parameters, in order to determine lithographic patterning performance (e.g., to determine a critical dimension (CD), a line edge roughness, or a line width roughness of a pattern produced with lithography). However, e-beam systems are usually limited in measuring other critical parameters, such as resist thickness or accordingly a pattern height of a pattern produced by lithography in a resist film. Notably, in this disclosure, the pattern height of a pattern produced in a resist film may be given (after patterning the pattern with lithography) by a difference of the thickness of the resist film in an unpatterned area (typically a masked area) and the thickness of the resist film in a patterned area (where the mask allowed the lithography to reach the resist film). A pattern has usually a repetitive structure of unpatterned and patterned areas.

The above limitation of the e-beam systems has caused the spread of competitive techniques, such as scatterometry. In addition, to mitigate the above limitation, a tilt may be introduced in an e-beam metrology system. In particular, height information may be extracted by tilting the electron beam at a certain angle. However, a serious limitation of introducing such a tilt is that in case of very thin resist films the tilt angle needs to be quite large. However, in doing so the e-beam system will lose resolution and may consequently become unable to measure very small features of the pattern. The tilt approach is, at best, feasible for thick resist films.

For this reason, the tilt approach is not suitable for patterns obtained with EUV in a resist film, since EUV requires very thin resist films. This is due to the fact that the CD scales down with the wavelength used for the lithography (smaller for EUV), and this needs to be compensated by using a larger numerical aperture (NA). However, then the depth of field (DoF) scales down with the numerical aperture (squared), and accordingly thinner resist films are needed to keep the aspect ratio low.

As a consequence, the tilt approach is less and less used, and especially for EUV no good solution exists.

SUMMARY

In view of the above, embodiments of this disclosure aim for a way to determine a pattern height of a pattern produced in a resist film with EUV. In particular, an objective of the disclosure is to enable using an e-beam system/SEM for performing the EUV-produced pattern metrology. The determination of the pattern height should be simple but effective and should of course yield accurate results.

These and other objectives are achieved by the embodiments of this disclosure as provided in the enclosed independent claims. Some implementations of these embodiments are defined further in the dependent claims.

In particular, this disclosure provides a way to accurately measure relative resist thicknesses and pattern heights of patterns produced in these resist films, by using an estimate of a contrast value and a calibration procedure.

A first aspect of the disclosure provides a device for determining a pattern height of a pattern produced with EUV lithography in a resist film, the device comprising a processor configured to: obtain a SEM image of the pattern from an SEM; determine a contrast value related to the pattern based on the obtained SEM image; and determine the pattern height based on calibration data and the determined contrast value.

Thus, the SEM can be used to determine the pattern height, without requiring a tilt of the electron beam. Nevertheless, the SEM can be used even if the pattern in produced with EUV lithography, i.e., in case of a very thin resist film. The determination performed by the device is effective but simple, and achieves very good accuracy. Overall, an improved EUV-produced pattern metrology is enabled by the device.

The calibration data may be pre-determined and may allow the processor to derive a pattern height of a pattern that is associated in the calibration data with the determined contrast value. The calibration data may be stored by the device, e.g., in a memory connected to the processor, or may be obtained by the device on demand. The calibration data may comprise a look-up table, in which contrast values and pattern heights are associated. The calibration data may also comprise one or more calibration curves as described below.

The SEM may be a conventional SEM, which may operate under control of the processor and/or the device.

In an implementation of the device, the processor is configured to determine the contrast value based on a maximum intensity and a minimum intensity in the obtained SEM image.

In an implementation of the device, the contrast value is determined by:

$$\frac{I_{max} - I_{min}}{I_{max} + I_{min}}$$

wherein $I_{max}$ is the maximum intensity and $I_{min}$ is the minimum intensity in the obtained SEM image.

This allows making a precise determination of the contrast value and accordingly the pattern height.

In an implementation of the device, the processor is configured to determine the pattern height based further on a nominal film thickness of the resist film.

The nominal film thickness, i.e., the target thickness of the resist film when generating the resist film (e.g., by coating or deposition) is a parameter that influences the contrast value for a given pattern height. Thus, the device is adapted to take this nominal film thickness into account, i.e., the calibration data may depend on the nominal film thickness.

In an implementation of the device, the processor is configured to determine the pattern height based further on a film type of the resist film.

The film type, e.g. the material of the resist film and/or the underlayer on which the resist film is provided, is a parameter that influences the contrast value for a given pattern height. Thus, the device is adapted to take this film type into account, i.e., the calibration data may depend on the film type.

In an implementation of the device, a nominal film thickness of the resist film is in a range of 5-50 nm; and/or the pattern height is in a range of 1-25 nm.

In an implementation of the device, a film type of the resist film is a spin-on-glass (SOG) type or a carbon-based-underlayer type.

In an implementation of the device, the calibration data includes a calibration dataset for each of one or more nominal film thicknesses and/or one or more film types.

In an implementation of the device, each calibration dataset comprises a calibration curve that indicates a relationship between a plurality of pre-determined contrast values and a plurality of pre-measured pattern heights.

In an implementation of the device, a pre-measured pattern height in a calibration dataset is based on an atomic force microscopy (AFM) measurement.

In an implementation of the device, the processor is further configured to: obtain a plurality of SEM images of the pattern from the SEM, wherein each SEM image is related to one of a plurality of implementations or parts of the pattern; determine a respective contrast value related to the pattern based on each of the plurality of SEM images; and determine the pattern height of the pattern based on the calibration data and an average contrast value calculated from the respective contrast values.

In an implementation of the device, the device is configured to control the SEM to scan an electron beam across the pattern to obtain the SEM image; and/or the device comprises the SEM or is included in the SEM.

In particular, the processor may be configured to control the SEM. The processor may be one of one or more processors of the SEM.

A second aspect of the disclosure provides a method for determining a pattern height of a pattern produced with EUV lithography in a resist film, the method comprising: obtaining a SEM image of the pattern from an SEM; determining a contrast value related to the pattern based on the obtained SEM image; and determining the pattern height based on calibration data and the determined contrast value.

In an implementation of the method, the method comprises determining the contrast value based on a maximum intensity and a minimum intensity in the obtained SEM image.

In an implementation of the method, the contrast value is determined by:

$$\frac{I_{max} - I_{min}}{I_{max} + I_{min}}$$

wherein $I_{max}$ is the maximum intensity and $I_{min}$ is the minimum intensity in the obtained SEM image.

In an implementation of the method, the method comprises determining the pattern height based further on a nominal film thickness of the resist film.

In an implementation of the method, the method comprises determining the pattern height based further on a film type of the resist film.

In an implementation of the method, a nominal film thickness of the resist film is in a range of 5-50 nm; and/or the pattern height is in a range of 1-25 nm.

In an implementation of the method, a film type of the resist film is a spin-on-glass type or a carbon-based-underlayer type.

In an implementation of the method, the calibration data includes a calibration dataset for each of one or more nominal film thicknesses and/or one or more film types.

In an implementation of the method, each calibration dataset comprises a calibration curve that indicates a relationship between a plurality of pre-determined contrast values and a plurality of pre-measured pattern heights.

In an implementation of the method, a pre-measured pattern height in a calibration dataset is based on an atomic force microscopy (AFM) measurement.

In an implementation of the method, the method comprises: obtaining a plurality of SEM images of the pattern from the SEM, wherein each SEM image is related to one of a plurality of implementations or parts of the pattern; determining a respective contrast value related to the pattern based on each of the plurality of SEM images; and determining the pattern height of the pattern based on the calibration data and an average contrast value calculated from the respective contrast values.

In an implementation of the method, the method comprises controlling the SEM to scan an electron beam across the pattern to obtain the SEM image.

The method of the second aspect and its above implementations provide similar benefits as described for the device of the first aspect and its respective implementations.

In a further implementation of the method, the method further comprises constructing the calibration data based on one or more respective calibration contrast values obtained for one or more respective test patterns, wherein each respective calibration contrast value is determined from one or more SEM images of one of the respective test patterns and an AFM height measurement of that test pattern.

The calibration data may be constructed by the device of the first aspect, or may be constructed by another device.

A third aspect of the disclosure provides a computer program comprising a program code for performing the method according to the second aspect or any of its implementation forms, when the program code is executed by a processor.

In particular, the processor may be a processor of the device of the first aspect and/or of an SEM. The program code may be stored in a memory of at least one of the device of the first aspect, the processor, and the SEM. The program code may include instructions to perform the method.

BRIEF DESCRIPTION OF THE FIGURES

The above described aspects and implementations are explained in the following description of embodiments with respect to the enclosed drawings.

DETAILED DESCRIPTION

Figure 1:
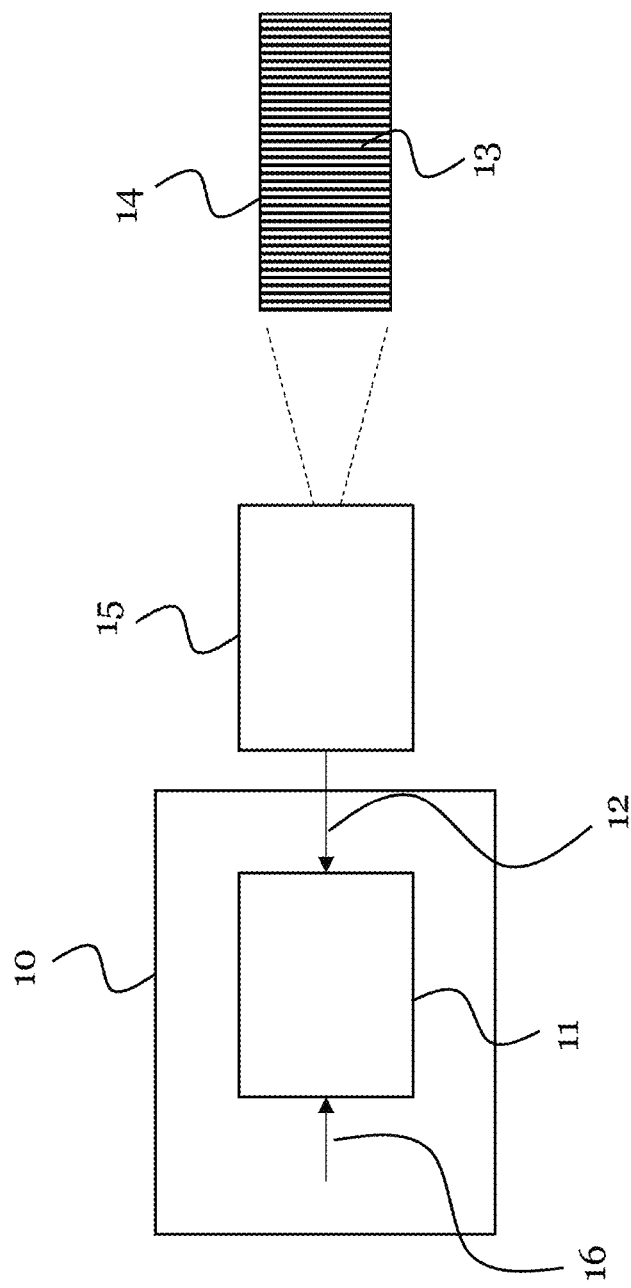
FIG. 1 shows a device according to an embodiment of this disclosure.

FIG. 1 shows a device 10 according to an embodiment of this disclosure. The device 10 is configured to determine a pattern height of a pattern 13. The pattern 13 is produced in a resist film, in particular, is produced with EUV lithography in the resist film 14. The resist film 14 may be a layer of a resist material, which is suitable for EUV (conventional materials may be used). The layer of the resist material may be provided on an underlayer of a certain material as described below. However, the device 10 is also capable of determining pattern heights of patterns that are not produced with EUV, but e.g. with another lithography technique in a resist film 14. The device 10 is specifically capable of determining small pattern heights in resist films 14 having a small nominal FT (wherein the nominal FT refers to the target thickness of the resist film 14 before patterning it with lithography). For example, a nominal FT of the resist film 14 may be in a range of 5-50 nm. Further, the pattern height of the pattern 13 in the resist film 14 may be in a range of 1-25 nm. The pattern height may be a step in height from an area of the resist film 14 patterned by the lithography (e.g., illuminated with EUV) to an area of the resist film 14 not patterned by the lithography (e.g., not illuminated with EUV, e.g. due to a mask).

The device 10 comprises a processor 11. The processor 11 may be configured to perform, conduct, or initiate the various operations of device 10, which are described in this disclosure. The processor 11 may comprise hardware and/or may be controlled by software. The hardware may comprise analog circuitry or digital circuitry, or both analog and digital circuitry. The digital circuitry may comprise components such as application-specific integrated circuits (ASICs), field-programmable arrays (FPGAs), digital signal processors (DSPs), or multi-purpose processors.

The device 10 may further comprise memory circuitry, which may store one or more instruction(s) that can be executed by the processor 11, in particular, under the control of software. For instance, the memory circuitry may comprise a non-transitory storage medium storing executable software code which, when executed by the processor 11, causes the various operations of the device 10 to be performed.

In one embodiment, the processor 11 comprises one or more processing units and a non-transitory memory connected to the one or more processing units. The non-transitory memory may carry executable program code which, when executed by the one or more processing units of the processor 11, causes the device 10 to perform, conduct, or initiate the operations or methods described in this disclosure.

Specifically, the processor 11 is configured to obtain a SEM image 12 of the pattern 13 from an SEM 15. For instance, the device 10 may receive the SEM image 12 from the SEM 15, for instance, upon request. To this end, there may be a wired or wireless connection between the device 10 and the SEM 15. The device 10 may be configured to control the SEM 15, in order to cause the SEM 15 to scan an electron beam across the pattern 13 in the resist film 14 (e.g. on a wafer or die) to obtain the SEM image 12. The SEM 15 may then provide the SEM image 12 to the device 10. The device 10 may also read the SEM image 12 from the SEM 15, for instance, a dedicated storage. Furthermore, the device 10 may also comprise the SEM 15, and the processor 11 may control the SEM 15 using an internal control protocol. Alternatively, the device 10 may be included in the SEM 15, and the processor 11 may be one of one or more processors of the SEM 15, and may be connected to an SEM image storage of the SEM 15.

Further, the processor 11 is configured to determine a contrast value related to the pattern 13 based on the obtained SEM image 12. In particular, the processor 11 may determine the contrast value from the SEM image 12. The processor 11 may, to this end, be configured to analyze intensities (intensity values) of the (pixels of the) SEM image 12. For instance, the processor 11 may be configured to determine the contrast value based on a maximum intensity and a minimum intensity in the SEM image 12, for example, according to the following formula:

$$\frac{I_{max} - I_{min}}{I_{max} + I_{min}}$$

wherein $I_{max}$ is the maximum intensity and $I_{min}$ is the minimum intensity. The processor 11 may determine the maximum intensity in the SEM image 12, may determine the minimum intensity in the SEM image 12, and may then calculate the contrast value.

Further, the processor 11 is configured to determine the pattern height based on calibration data 16 and based on the determined contrast value. Optionally, the determination may be based further on a nominal FT of the resist film 14 and/or based further on a film type of the resist film 14. For instance, the processor 11 may be configured to obtain the calibration data 16 from a memory of the device 10, and may perform a matching procedure of the determined contrast value with the calibration data 16. The calibration data 16 may comprise one or more calibration curves, wherein each calibration curve may indicate a relationship between a plurality of pre-determined contrast values and a plurality of pre-measured pattern heights. In this case, the processor 11 may select one of the calibration curves (e.g., based on a nominal FT and/or a film type of the resist film 14 comprising the pattern 13 imaged by the SEM image 12), and may find a pre-determined contrast value that matches the determined contrast value determined based on the SEM image 12. The processor 11 may then determine the pattern height of the pattern 13 to be equal to the pre-measured pattern height associated, for the selected calibration curve, with the pre-determined contrast value that matches the determined contrast value.

Similar to the above procedure, the processor 11 may also obtain a plurality of SEM images 12 of the pattern 13 from the SEM 15 (the above-mentioned SEM image 12 may be one of the plurality of SEM images 12), wherein each SEM image 12 may be related to one of a plurality of different implementations or parts of the pattern 13. For instance, the pattern 13 may be implemented on multiple dies (e.g. on the same wafer), wherein the dies are processed in parallel. Each of the plurality of SEM images 12 may correspond to one of the multiple dies. The processor 11 may then be further configured to determine a respective contrast value related to the pattern 13 based on or from each of the plurality of SEM images 12. That is, the processor 11 may obtain multiple contrast values, and may be further configured to determine the pattern height of the pattern 13 based on the calibration data 16 and an average contrast value, which the processor 11 is configured to determine from the multiple contrast values.

The following example embodiment describes a complete methodology to determine the pattern height of the pattern 13 in the resist film 14, wherein the device 10 and top-down SEM images (e.g. CD-SEM images) are used:

Coating of one or more calibration wafers using a desired range of a nominal FT of resist films 14 (e.g., coating the calibration wafers with resist films 14 having, respectively, a FT of 10, 15, 20, 25 and 30 nm).

Exposure of the wafers (e.g. with EUV) using a mask, wherein at least one test pattern is produced in the resist films 14. The at least one test pattern may be designed to allow AFM pattern height measurements afterwards.

Collecting one or more SEM images from the one or more calibration wafers. In particular, SEM images for one or more dies (e.g., for 5 dies) on the calibration wafers. Thereby, SEM images may be obtained at, respectively, a best focus-through dose for the calibration wafers.

Calculate respectively a contrast value of the test pattern in the SEM images for all the dies and for all the calibration wafers, in order to obtain one or more calibration contrast values. A number of the SEM images can depend on how accurate the contrast value determination has to be (e.g., 50 SEM images per die can be obtained for high accuracy). Each respective calibration contrast value may be determined based on maximum and minimum intensity in a SEM image. For instance, each calibration contrast value may be calculated as follows:

$$\text{calibration contrast value} = \frac{I_{max} - I_{min}}{I_{max} + I_{min}}$$

with $I_{max}$ and $I_{min}$ being the maximum and minimum intensity in the SEM image, respectively.

Collect AFM (or other technique) pattern height measurements for the same one or more dies, for which the calibration contrast values were calculated, in order to obtain pre-measured pattern heights.

Construct one or more calibration curves (pre-measured pattern heights versus pre-determined calibration contrast values per calibration curve). Different calibration curves for different nominal FT and/or different types of resist films may be constructed. The calibration curve may be collected together to form the calibration data 16. Notably, one calibration curve may hold true for the exact same combination of resist film FT and underlayer used to carry the resist film.

Now any mask can be used to further determine, by the device 10 as described above, the pattern height of any pattern 13 produced in any resist film 14, by using the calibration data 16 and based on an SEM image 12 taken from the pattern 13.

Figure 2:
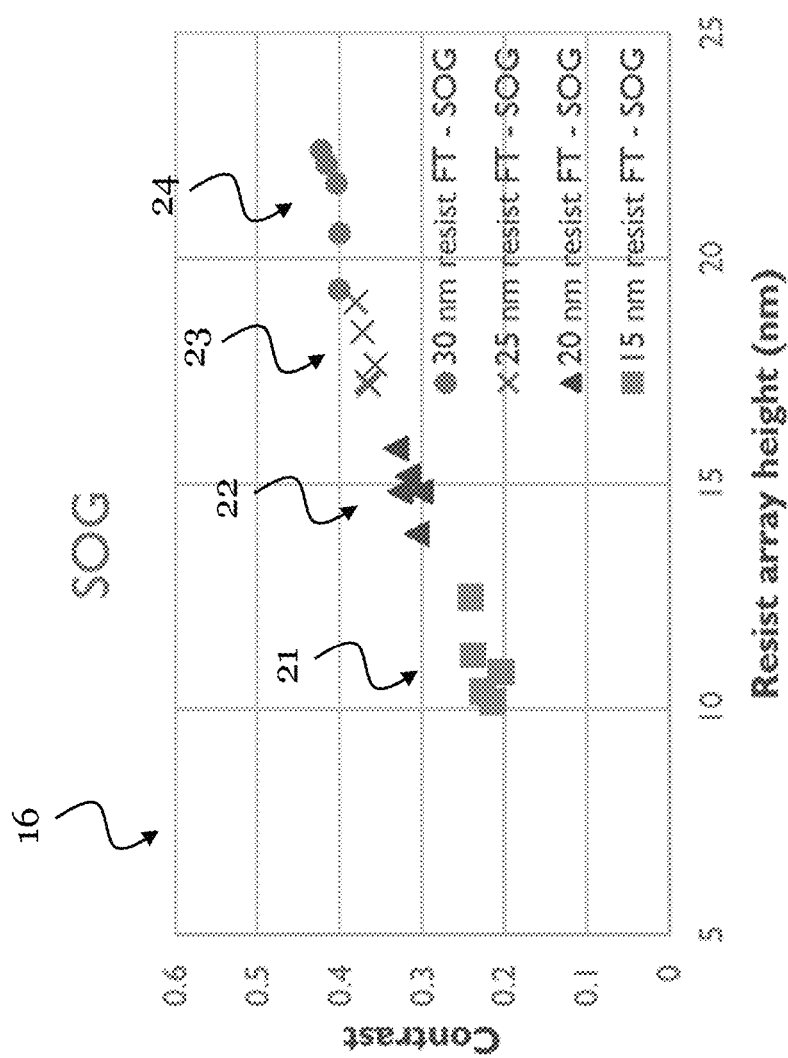
FIG. 2 shows calibration curves for a resist film of a SOG type, i.e., the resist film is provided on a SOG underlayer.
Figure 3:
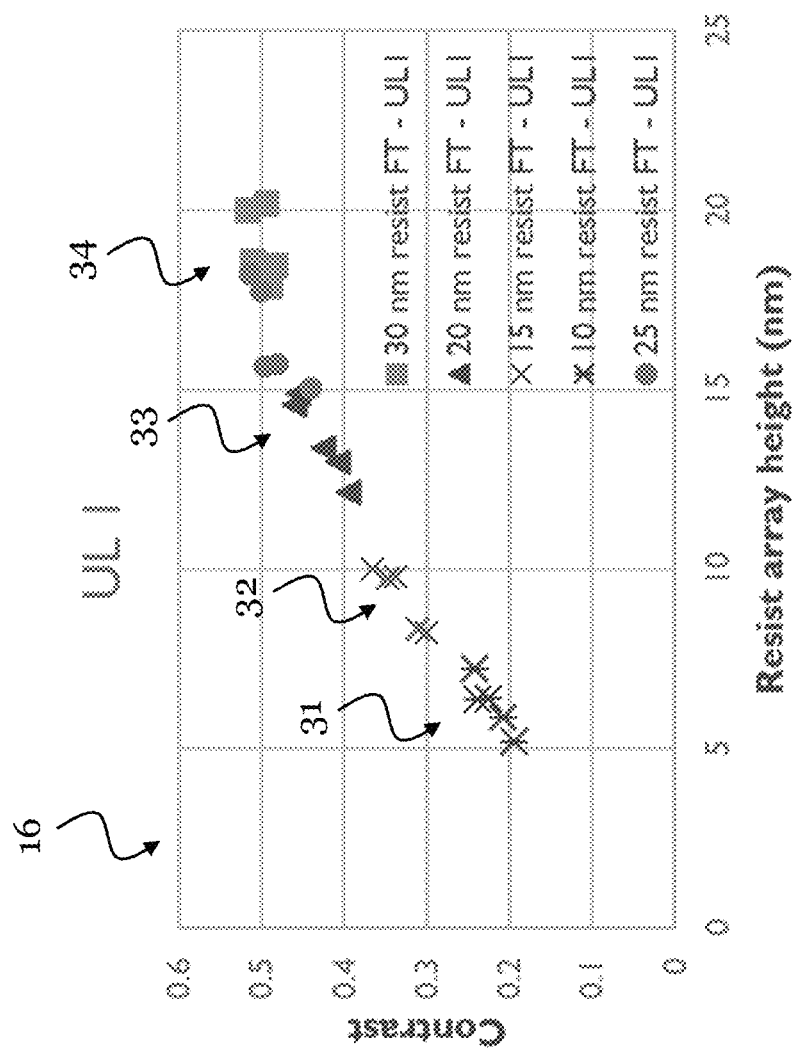
FIG. 3 shows calibration curves for a resist film of a carbon-based-underlayer type, i.e. the resist film (the same as in FIG. 2) is provided on a carbon-based underlayer (UL).

Two examples of calibration data 16 for the same resist film 14 on different underlayers are shown in FIG. 2 and FIG. 3, respectively. In particular, FIG. 2 shows calibration data 16 for a resist film 14 of the SOG type, i.e., the resist film 14 is provided on a SOG underlayer. FIG. 3 shows calibration data 16 for a resist film 14 of the carbon-based-underlayer type, i.e., the resist film 14 is provided on a carbon-based underlayer (particularly, referred to as UL1).

FIG. 2 shows that the calibration data 16 may comprises multiple calibration datasets 21-24 for different resist films 14 of the SOG type, specifically one calibration dataset for each of multiple nominal film thicknesses (15 nm, 20 nm, 25 nm, and 30 nm) of the resist film 14. The contrast value is lower for a calibration dataset of a lower nominal FT. Furthermore, each calibration dataset 21-24 may be represented, as shown in FIG. 2, as a calibration curve that indicates a relationship between a plurality of pre-determined contrast values ('contrast' as normalized value between 0-1 on the y-axis) and a plurality of pre-measure pattern heights ('resist array height' in nm on the x-axis). It can be derived, that for each calibration dataset 21-24, a lower contrast value corresponds to a smaller pattern height.

FIG. 3 shows (in a similar manner as shown in FIG. 2) that the calibration data 16 may further comprise multiple calibration datasets 31-34 for different resist films 14 of the UL1 type, specifically one calibration dataset for each of multiple nominal film thicknesses (15 nm, 20 nm, 25 nm, and 30 nm) of the resist film 14. That is, the calibration data 16 may comprise calibration datasets 21-24 and calibration datasets 31-34, i.e., a calibration dataset for each of one or more film types and for each of one or more FT of the resist film 14. It can again be derived from FIG. 3, that for each calibration dataset 31-34, a lower contrast value corresponds to a smaller pattern height.

It is noted that in FIG. 2 and FIG. 3, it is demonstrated that a small change in the pattern height influences the contrast value to an amount, which is significant enough to accurately determine the pattern height (and to distinguish it, by different contrast value, from other pattern heights).

Figure 4:
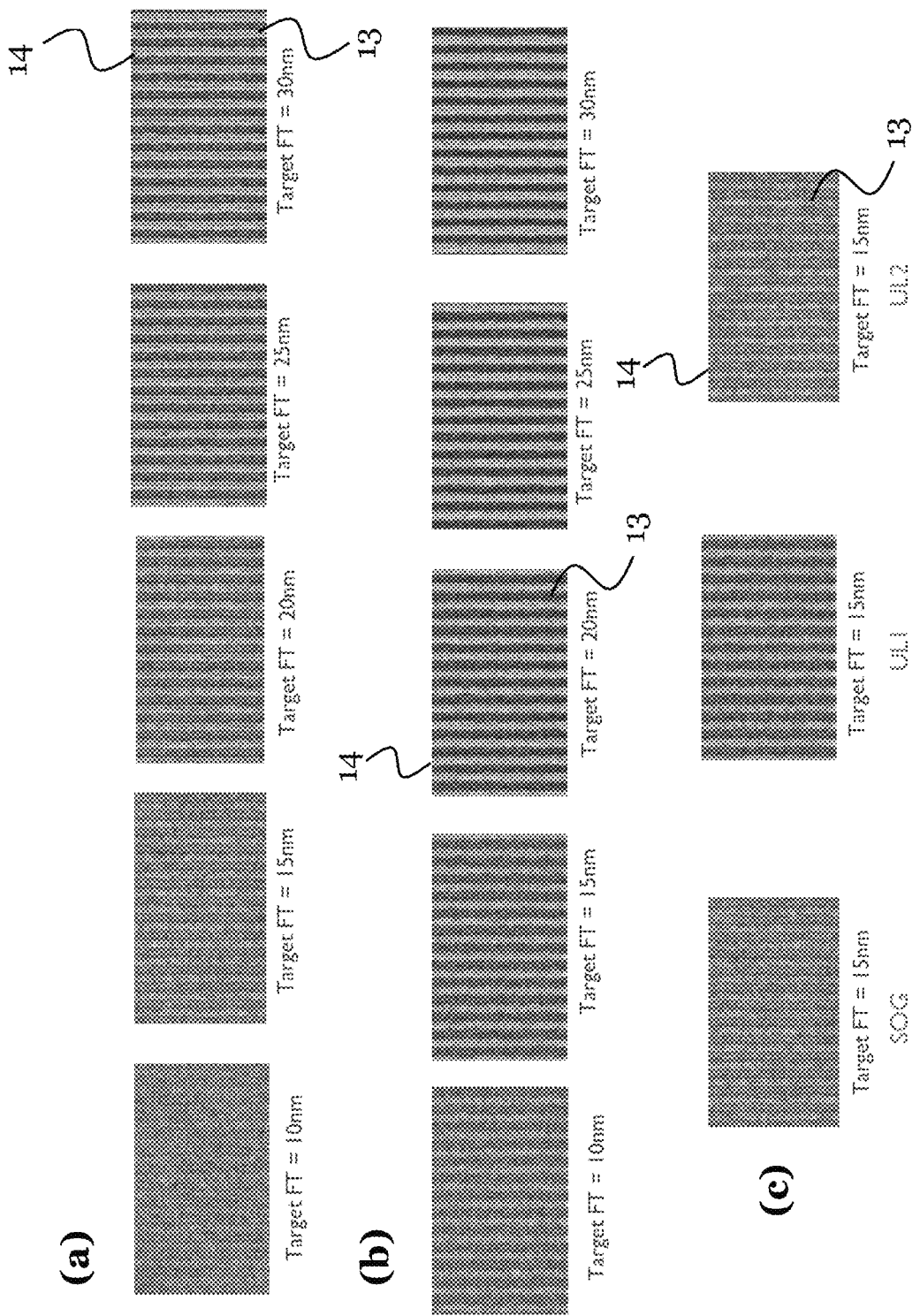
FIG. 4 shows multiple SEM images taken for different film types (SOG, UL) and for different nominal film thickness (FT).

FIG. 4 shows exemplary SEM images taken for different film types (SOG, UL1, and UL2) and different nominal FT. In particular, FIG. 4(a) shows different SEM images for different nominal FT (10-30 nm) for a resist film 14 of the SOG type. FIG. 4(b) shows different SEM images for different nominal FT (10-30 nm) for a resist film 14 of a carbon-based UL type (UL1). FIG. 4(c) shows different SEM images 12 for different resist film 14 types (SOG, UL1, and a further UL type referred to as UL2) for the same nominal (or target) resist FT (namely 15 nm).

It can be derived from FIG. 4, that the contrast value of the pattern 13 in the SEM image 12 depends on the nominal FT (wherein a lower nominal FT leads to a lower contrast value) and depends further on the type of the resist film 14 (wherein SOG leads to a lower contrast value at the same nominal FT than UL1 and UL2). Accordingly, the device 10 may be configured to determine the pattern height of the pattern 13 based further on a nominal film thickness of the resist film 14 and/or on a film type of the resist film 14, in which the pattern 13 is produced.

Figure 5:
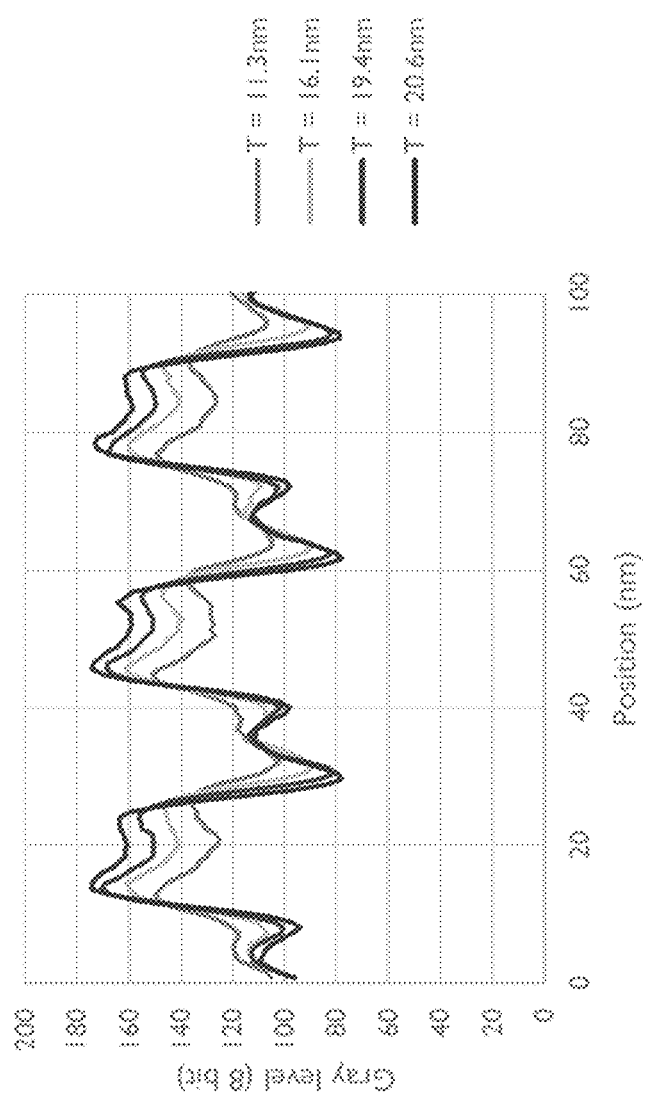
FIG. 5 shows a way to determine a contrast value, in particular based on a determination of the grey level in the SEM image versus position, and for different FT.

FIG. 5 shows how the contrast value may be determined from an SEM image 12 for different FT (here, as example, 11.3 nm, 16.1 nm, 19.4 nm, 20.6 nm). It can be seen that a grey level (8 bit, on the y-axis) of the SEM image 12 follows the pattern 13 produced in the resist film 14 (i.e., at different position of the resist film 14, due to the pattern 13, the grey level is different and shows a periodic behavior). The change in grey level is notably more pronounced for higher nominal FT. Form these grey levels, the contrast value can be derived, e.g., based on maximum and minimum intensity (related to grey level) as described above.

Figure 6:
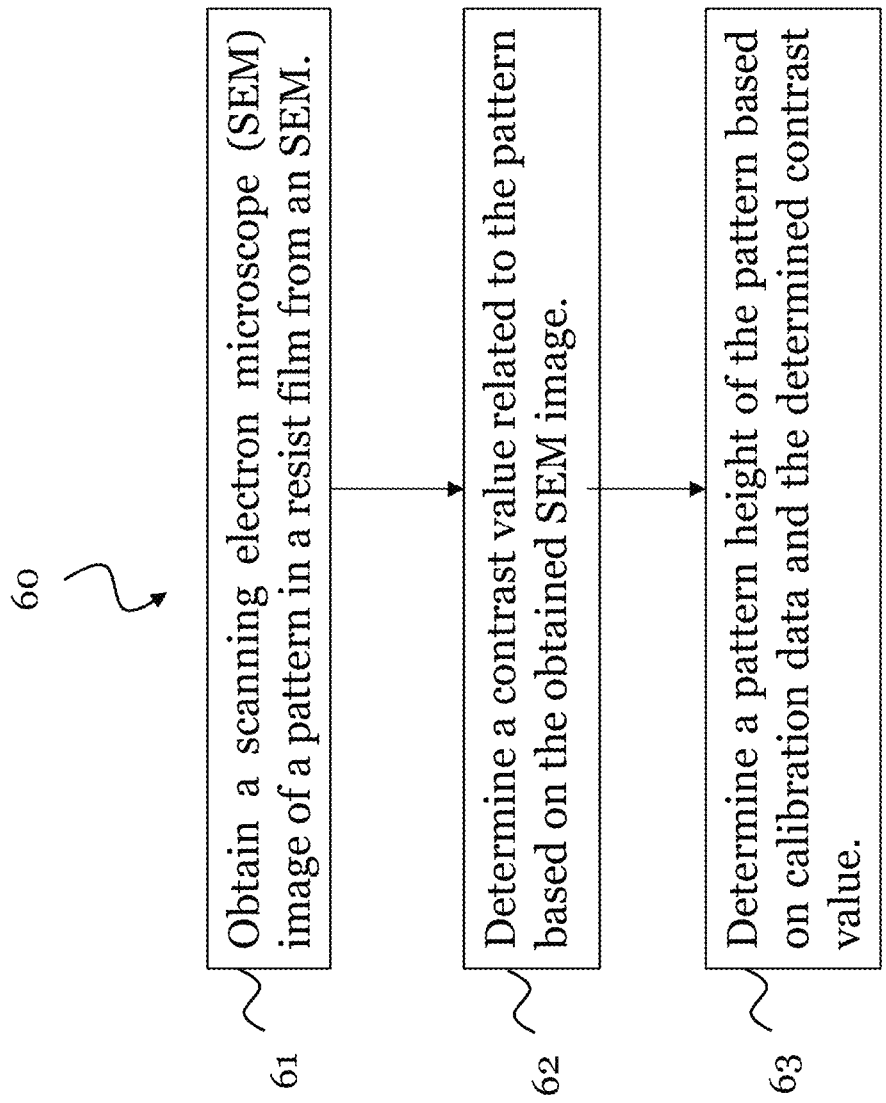
FIG. 6 shows a method according to an embodiment of this disclosure.

FIG. 6 shows a method 60 according to an embodiment of this disclosure. The method 60 can be used for determining a pattern height of a pattern 13 produced with EUV lithography in a resist film 14. The method 60 may be performed by the device 10 as shown in FIG. 1 and a described above.

The method 60 comprises a step 61 of obtaining a SEM image 12 of the pattern 13 from an SEM 15. The method 60 further comprises a step 62 of determining a contrast value related to the pattern 13 based on the obtained SEM image 12. Then, the method 60 comprises a step 63 of determining the pattern height of the pattern 13 based on calibration data 16 (e.g., as described and constructed above) and based on the determined contrast value.

In summary, the embodiments of this disclosure achieve at least the following aspects. The pattern height determination of any pattern 13 in a resist film 14 by SEM 15 is enabled. In particular, patterns 13 produced with EUV, which are particularly produced in thin resist films 14 (e.g., below 100 nm, or even 50 nm, or less than 50 nm). As soon as the calibration data 16 (e.g. the calibration curves) is generated, any SEM image 12 can be related to a pattern height through the contrast determination, for instance, performed by the device 10 described in this disclosure.

What is claimed is:

1. A device for determining a pattern height of a pattern produced with extreme ultraviolet, EUV, lithography in a resist film, the device comprising a processor configured to:
   obtain a scanning electron microscope, SEM, image of the pattern from an SEM;
   determine a contrast value related to the pattern based on the obtained SEM image; and
   determine the pattern height based on calibration data and the determined contrast value.

2. The device according to claim 1, wherein the processor is configured to determine the contrast value based on a maximum intensity and a minimum intensity in the obtained SEM image.

3. The device according to claim 2, wherein the contrast value is determined by:

$$\frac{I_{max} - I_{min}}{I_{max} + I_{min}}$$

wherein $I_{max}$ is the maximum intensity and $I_{min}$ is the minimum intensity in the obtained SEM image.

4. The device according to claim 1, wherein the processor is configured to determine the pattern height based further on a nominal film thickness of the resist film.

5. The device according to claim 1, wherein the processor is configured to determine the pattern height based further on a film type of the resist film.

6. The device according to claim 1, wherein a nominal film thickness of the resist film is in a range of 5-50 nm.

7. The device according to claim 1, wherein the pattern height is in a range of 1-25 nm.

8. The device according to claim 1, wherein a film type of the resist film is a spin-on-glass type.

9. The device according to claim 1, wherein a film type of the resist film is a carbon-based-underlayer type.

10. The device according to claim 1, wherein the calibration data includes a calibration dataset for each of one or more nominal film thicknesses and/or one or more film types.

11. The device according to claim 10, wherein each calibration dataset comprises a calibration curve that indicates a relationship between a plurality of pre-determined contrast values and a plurality of pre-measured pattern heights.

12. The device according to claim 11, wherein a pre-measured pattern height in a calibration dataset is based on an atomic force microscopy, AFM, measurement.

13. The device according to claim 1, wherein the processor is configured to:
   obtain a plurality of SEM images of the pattern from the SEM, wherein each SEM image is related to one of a plurality of implementations or parts of the pattern;
   determine a respective contrast value related to the pattern based on each of the plurality of SEM images; and
   determine the pattern height of the pattern based on the calibration data and an average contrast value calculated from the respective contrast values.

14. The device according to claim 1, wherein the device is configured to control the SEM to scan an electron beam across the pattern to obtain the SEM image.

15. The device according to claim 1, wherein the device comprises the SEM or is included in the SEM.

16. A method for determining a pattern height of a pattern produced with extreme ultraviolet, EUV, lithography in a resist film, the method comprising:
   obtaining a scanning electron microscope, SEM, image of the pattern from an SEM;
   determining a contrast value related to the pattern based on the obtained SEM image; and
   determining the pattern height based on calibration data and the determined contrast value.

17. The method according to claim 16, further comprising:
   constructing the calibration data based on one or more respective calibration contrast values obtained for one or more respective test patterns,
   wherein each respective calibration contrast value is determined from one or more SEM images of one of the respective test patterns and an AFM height measurement of that test pattern.

18. A computer program comprising a program code for performing the method according to claim 16, when the program code is executed by a processor.

19. A computer-implemented method for determining a pattern height of a pattern produced with extreme ultraviolet, EUV, lithography in a resist film, the method comprising:
   obtaining a scanning electron microscope, SEM, image of the pattern from an SEM;
   determining a contrast value related to the pattern based on the obtained SEM image; and
   determining the pattern height based on calibration data and the determined contrast value.

20. The computer-implemented method according to claim 19, further comprising:
   constructing the calibration data based on one or more respective calibration contrast values obtained for one or more respective test patterns,
   wherein each respective calibration contrast value is determined from one or more SEM images of one of the respective test patterns and an AFM height measurement of that test pattern.

* * * * *